(12) United States Patent
Kikuchi

(10) Patent No.: US 6,576,377 B2
(45) Date of Patent: Jun. 10, 2003

(54) PHOTO MASK PATTERN DESIGNING METHOD, RESIST PATTERN FABRICATING METHOD AND SEMICONDUCTOR DEVICE MANUFACTURING METHOD

(75) Inventor: Koji Kikuchi, Kanagawa (JP)

(73) Assignee: Sony Corporation (JP)

( * ) Notice: Subject to any disclaimer, the term of this patent is extended or adjusted under 35 U.S.C. 154(b) by 5 days.

(21) Appl. No.: 09/783,973

(22) Filed: Feb. 16, 2001

(65) Prior Publication Data

US 2002/0006553 A1 Jan. 17, 2002

(30) Foreign Application Priority Data

Feb. 24, 2000 (JP) ........................................ 2000-047605

(51) Int. Cl.[7] .............................. G03F 9/00; G03C 5/00
(52) U.S. Cl. .......................................... 430/5; 430/311
(58) Field of Search ............................ 430/5, 311, 322, 430/323, 324, 394; 378/35

(56) References Cited

U.S. PATENT DOCUMENTS

| | | | | |
|---|---|---|---|---|
| 5,536,604 A | * | 7/1996 | Ito ............................ | 430/5 |
| 5,858,580 A | * | 1/1999 | Wang et al. ............... | 430/5 |
| 5,863,677 A | | 1/1999 | Nakao ....................... | 430/5 |
| 5,958,656 A | | 9/1999 | Nakao ....................... | 430/394 |
| 6,335,128 B1 | * | 1/2002 | Cobb et al. ............... | 430/5 |

FOREIGN PATENT DOCUMENTS

| | | |
|---|---|---|
| DE | 28 35 313 | 8/1978 |
| EP | 0 097 831 | 6/1983 |
| JP | 7-84355 | 3/1995 |

* cited by examiner

*Primary Examiner*—S. Rosasco
(74) *Attorney, Agent, or Firm*—Rader, Fishman & Grauer PLLC; Ronald P. Kananen, Esq.

(57) ABSTRACT

For the purpose of a sufficient exposure tolerance and a sufficient lithographic process tolerance like the depth of focus while reducing the line width difference due to the pattern density of a resist pattern, correction is made to the overlapping width $a_1$ of a translucent region of a phase shift mask and a shading region of a binary mask used upon high-resolution exposure (isolated pattern), the overlapping width $a_2$ (L/S pattern), line width $b_1$ in a phase shift mask (isolated pattern) and the line width $b_2$ (L/S pattern) toward decreasing the line width difference among resist patterns when a resist pattern having patterns like an isolated pattern and an L/S pattern that are different in pattern density.

25 Claims, 9 Drawing Sheets

Fig. 3A

| EXPOSURE (mJ/cm²) | FOCUS (μm) | | | | | | | | | | | | | | |
|---|---|---|---|---|---|---|---|---|---|---|---|---|---|---|---|
| | -0.7 | -0.6 | -0.5 | -0.4 | -0.3 | -0.2 | -0.1 | 0 | 0.1 | 0.2 | 0.3 | 0.4 | 0.5 | 0.6 | 0.7 |
| 28 | | | | | | | | 0.113 | | | | | | | |
| 29 | | | | 0.082 | 0.107 | 0.107 | 0.114 | 0.111 | | | | | | | |
| 30 | | | x | 0.094 | 0.1 | 0.107 | 0.11 | 0.108 | 0.102 | 0.083 | | | | | |
| 31 | | | x | 0.093 | 0.098 | 0.107 | 0.107 | 0.102 | 0.106 | 0.084 | | | | | |
| 32 | | | | 0.064 | 0.102 | 0.099 | 0.103 | 0.103 | 0.075 | 0.085 | | | | | |
| 33 | | | | x | 0.098 | 0.091 | 0.094 | 0.097 | 0.081 | | | | | | |
| 34 | | | | | 0.086 | 0.093 | 0.096 | 0.08 | | | | | | | |
| 35 | | | | x | 0.096 | 0.081 | 0.091 | 0.097 | 0.067 | | | | | | |
| 36 | | | | | 0.053 | 0.091 | 0.09 | 0.078 | | | | | | | |
| 37 | | | | | | 0.078 | 0.083 | 0.092 | x | | | | | | |
| 38 | | | | | | | | 0.086 | | | | | | | |
| 39 | | | | | | | | 0.062 | | | | | | | |
| 40 | | | | | | | | | | | | | | | |
| 41 | | | | | | | | | | | | | | | |
| 42 | | | | | | | | | | | | | | | |

Fig. 3B

| EXPOSURE (mJ/cm²) | FOCUS (μm) | | | | | | | | | | | | | | |
|---|---|---|---|---|---|---|---|---|---|---|---|---|---|---|---|
| | -0.7 | -0.6 | -0.5 | -0.4 | -0.3 | -0.2 | -0.1 | 0 | 0.1 | 0.2 | 0.3 | 0.4 | 0.5 | 0.6 | 0.7 |
| 45 | | | | | | | 0.117 | | | | | | | | |
| 46 | | | | | | 0.107 | 0.105 | 0.113 | | | | | | | |
| 47 | | | | | | | 0.11 | 0.113 | | | | | | | |
| 48 | | | | | 0.087 | 0.101 | 0.106 | 0.107 | 0.104 | 0.109 | 0.11 | 0.113 | | | |
| 49 | | | | | 0.084 | 0.103 | 0.106 | 0.104 | 0.109 | 0.107 | 0.106 | 0.101 | 0.111 | | |
| 50 | | | | | 0.082 | 0.098 | 0.1 | 0.105 | 0.105 | 0.105 | 0.104 | 0.092 | 0.103 | | |
| 51 | | | | | 0.089 | 0.09 | 0.098 | 0.102 | 0.1 | 0.101 | 0.101 | 0.095 | x | | |
| 52 | | | | | x | 0.092 | 0.091 | 0.102 | 0.096 | 0.095 | 0.101 | 0.084 | 0.089 | | |
| 53 | | | | | | 0.08 | 0.093 | 0.093 | 0.097 | 0.094 | 0.084 | | | | |
| 54 | | | | | | | 0.081 | | | | | | | | |
| 55 | | | | | | | | | | | | | | | |
| 56 | | | | | | | | | | | | | | | |
| 57 | | | | | | | | | | | | | | | |
| 58 | | | | | | | | | | | | | | | |
| 59 | | | | | | | | | | | | | | | |

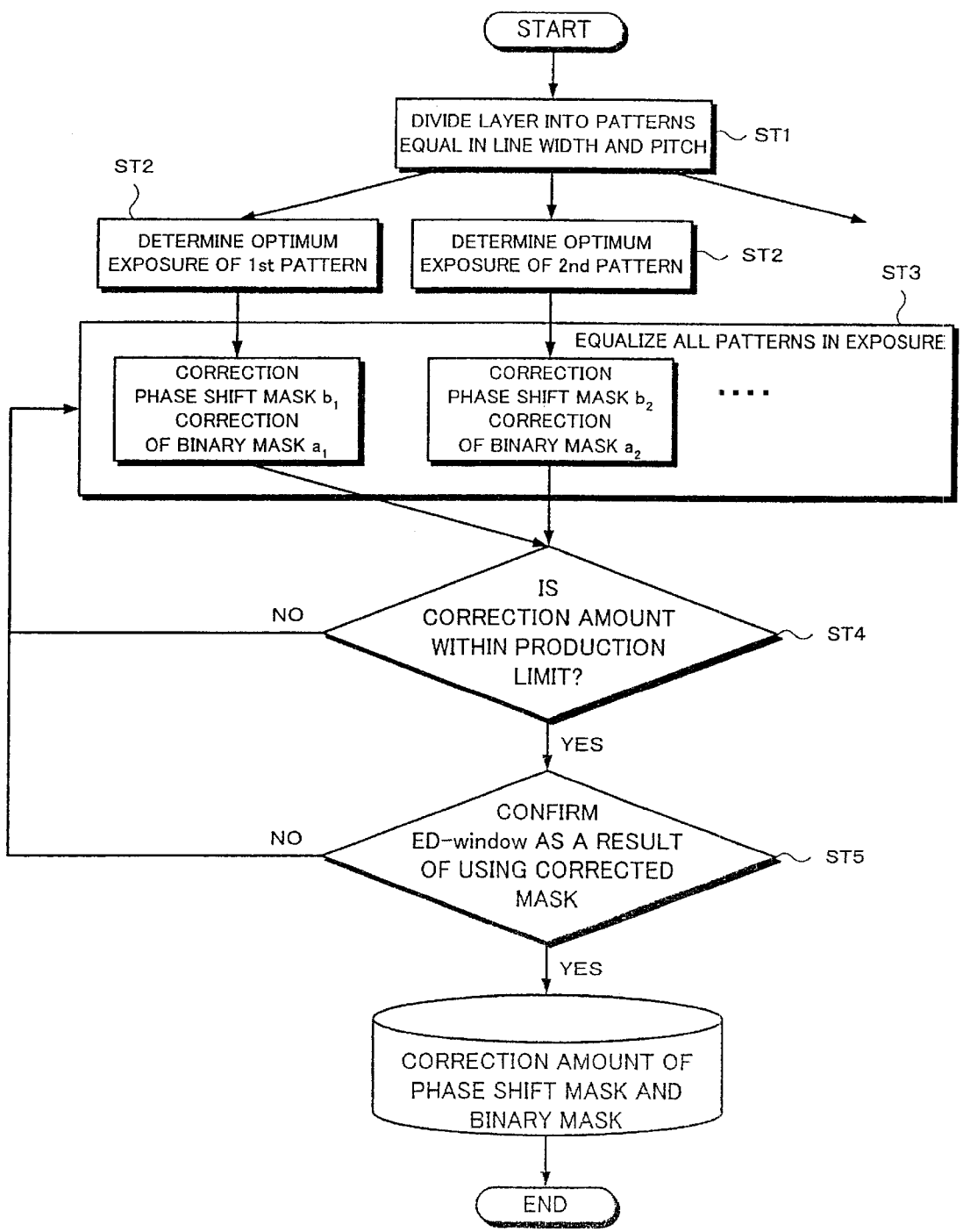

Fig. 8A

| EXPOSURE (mJ/cm²) | FOCUS (μm) | | | | | | | | | | | | | | |
|---|---|---|---|---|---|---|---|---|---|---|---|---|---|---|---|
| | -0.7 | -0.6 | -0.5 | -0.4 | -0.3 | -0.2 | -0.1 | 0 | 0.1 | 0.2 | 0.3 | 0.4 | 0.5 | 0.6 | 0.7 |
| 38 | | | | | | | | | | | | | | | |
| 39 | | | | | | | | | | | | | | | |
| 40 | | | | | | | | 0.111 | | | | | | | |
| 41 | | | | | | 0.116 | 0.116 | 0.103 | 0.106 | 0.075 | 0.069 | | | | |
| 42 | | | | 0.085 | 0.11 | 0.111 | 0.109 | 0.103 | 0.095 | 0.084 | | | | | |
| 43 | | | | 0.068 | 0.106 | 0.102 | 0.104 | 0.106 | 0.088 | 0.085 | | | | | |
| 44 | | | | 0.097 | 0.07 | 0.104 | 0.103 | 0.082 | 0.096 | x | | | | | |
| 45 | | | | 0.062 | 0.098 | 0.101 | 0.102 | 0.103 | 0.077 | 0.082 | | | | | |
| 46 | | | | 0.093 | 0.076 | 0.106 | 0.101 | 0.093 | 0.09 | x | | | | | |
| 47 | | | | x | 0.093 | 0.093 | 0.097 | 0.101 | 0.068 | | | | | | |
| 48 | | | | | 0.095 | 0.081 | 0.093 | 0.099 | | | | | | | |
| 49 | | | | | 0.064 | 0.095 | 0.089 | 0.07 | | | | | | | |
| 50 | | | | | | | | | | | | | | | |
| 51 | | | | | | | | | | | | | | | |
| 52 | | | | | | | | | | | | | | | |

Fig. 8B

| EXPOSURE (mJ/cm²) | FOCUS (μm) | | | | | | | | | | | | | | |
|---|---|---|---|---|---|---|---|---|---|---|---|---|---|---|---|
| | -0.7 | -0.6 | -0.5 | -0.4 | -0.3 | -0.2 | -0.1 | 0 | 0.1 | 0.2 | 0.3 | 0.4 | 0.5 | 0.6 | 0.7 |
| 38 | | | | | | | | | | | | | | | |
| 39 | | | | | | | 0.112 | | | | | | | | |
| 40 | | | | 0.071 | 0.097 | 0.1 | 0.103 | 0.107 | 0.109 | 0.103 | 0.104 | 0.106 | | | |
| 41 | | | | 0.087 | 0.09 | 0.102 | 0.102 | 0.102 | 0.099 | 0.099 | 0.099 | 0.088 | | | |
| 42 | | | | 0.076 | 0.098 | 0.091 | 0.101 | 0.1 | 0.101 | 0.097 | 0.089 | | | | |
| 43 | | | | x | 0.09 | 0.09 | 0.096 | 0.095 | 0.097 | 0.096 | 0.08 | | | | |
| 44 | | | | | x | 0.092 | 0.09 | 0.092 | 0.093 | 0.09 | 0.086 | | | | |
| 45 | | | | | | 0.085 | 0.091 | 0.093 | 0.09 | 0.087 | | | | | |
| 46 | | | | | | | | 0.089 | | | | | | | |
| 47 | | | | | | | | 0.084 | | | | | | | |
| 48 | | | | | | | | | | | | | | | |
| 49 | | | | | | | | | | | | | | | |
| 50 | | | | | | | | | | | | | | | |
| 51 | | | | | | | | | | | | | | | |
| 52 | | | | | | | | | | | | | | | |

Fig. 9

| EXPOSURE (mJ/cm²) | FOCUS(μm) | | | | | | | | | | | | | | |
|---|---|---|---|---|---|---|---|---|---|---|---|---|---|---|---|
| | -0.7 | -0.6 | -0.5 | -0.4 | -0.3 | -0.2 | -0.1 | 0 | 0.1 | 0.2 | 0.3 | 0.4 | 0.5 | 0.6 | 0.7 |
| 38 | | | | | | | | | | | | | | | |
| 39 | | | | | | | | | | | | | | | |
| 40 | | | | | | | | | | | | | | | |
| 41 | | | | | | | | | | | | | | | |
| 42 | | | | | | | | | | | | | | | |
| 43 | | | | | | | | | | | | | | | |
| 44 | | | | | | | | | | | | | | | |
| 45 | | | | | | | | | | | | | | | |
| 46 | | | | | | | | | | | | | | | |
| 47 | | | | | | | | | | | | | | | |
| 48 | | | | | | | | | | | | | | | |
| 49 | | | | | | | | | | | | | | | |
| 50 | | | | | | | | | | | | | | | |
| 51 | | | | | | | | | | | | | | | |
| 52 | | | | | | | | | | | | | | | |

31

PHOTO MASK PATTERN DESIGNING METHOD, RESIST PATTERN FABRICATING METHOD AND SEMICONDUCTOR DEVICE MANUFACTURING METHOD

BACKGROUND OF THE INVENTION

1. Field of the Invention

This invention relates to a photo mask pattern designing method, resist pattern fabricating method and semiconductor device manufacturing method, especially suitable for application to correction of the pattern configuration of a photo mask used in a lithographic process for multiplexing exposure.

2. Description of the Related Art

In the industry of manufacturing semiconductor devices, along with progressive miniaturization of patterns, the demand for higher resolution beyond the resolution limit determined by the wavelength of light has been getting larger also in lithographic processes.

And recently, a phase shift mask has come to be used as a technique for making a micro pattern below the wavelength of light used upon exposure. With this type of phase shift mask, a high resolution can be obtained by using a phase difference of beams of light transmitting the mask. Therefore, adjacent beams of transmitted light must be inverted in phase from each other.

Further, as a technology for making a micro pattern using such a phase shift mask, there is a method which once executes exposure by using the phase shift mask, and thereafter again executes exposure for removing an undesired pattern produced by the first exposure, that is, executes twin exposure, to make a pattern. The twin exposure technique is under practical use for manufacturing high-speed LSI.

In case of resolving pattern configurations different in pattern density, a difference in line width undesirably occurs due to the pattern densities after resolution. Thus, for reducing the line width difference, there has been proposed a photo mask pattern designing method that corrects the phase shift mask used for high-resolution exposure toward reducing the line width difference.

However, such correction often causes undesirable decrease of tolerance in exposure and/or tolerance in depth of focus, and possibly reduces the window (ED window) made up of the exposure tolerance and the depth of focus.

Further, the phase shift mask is fabricated in a critical region of the photo mask fabricating technique. Therefore, correction for thinning the line width of the pattern on the photo mask applies a large load to fabrication of the mask.

Additionally, together with miniaturization of patterns, difference in density of patterns on a photo mask is getting larger. The increase of difference in density is accompanied by a tendency toward a larger amount of correction of patterns.

Under such movement, there has been a demand for the development of a correction technique of a photo mask fabricated in a lithographic process that can minimize reduction of a pattern on a photo mask by taking account of the critical region of the mask fabricating technique. There has also been a demand for the development of a correction technique of a photo mask fabricated in a lithographic process that can reduce the line width range upon making a resist pattern different in density, having sparse and dense portions.

OBJECT AND SUMMARY OF THE INVENTION

It is therefore an object of the invention to provide a photo mask pattern designing method that can be used upon correcting a pattern on a photo mask used for making a single-layered resist pattern having patterns different in density and line width by a plurality of exposure steps. The method can provide a sufficient tolerance for exposure and a sufficient tolerance for lithographic process in term of the depth of focus, for example, while decreasing the line width difference by the pattern density of the resist pattern made by exposure.

It is a further object of the invention to provide a resist pattern fabricating method that can be used upon making a resist pattern through a plurality of exposure steps using a plurality of different photo masks and can precisely make a single-layered resist pattern having patterns different in pattern density and line width while providing a sufficient tolerance for exposure and a sufficient tolerance for lithographic process in terms of the depth of focus, for example.

It is a still further object of the invention to provide a semiconductor device manufacturing method that can precisely make a resist pattern different in pattern density while providing a sufficient tolerance for exposure and a sufficient tolerance for lithographic process in terms of the depth of focus to manufacture a semiconductor device having a combination of patterns different in density, and to manufacture a semiconductor device with a high reliability even by mass production.

According to the first aspect of the invention, there is provided a photo mask pattern designing method configured to correct pattern configuration of at least one of a plurality of kinds of photo masks used upon making a single-layered resist pattern by transferring pattern configuration through a plurality of times of exposure of a resist coated on a substrate, characterized in that:

a first photo mask used for exposure using interference of light among the plurality of times of exposure has a first shading region and a first translucent region adjacent to each other;

a second photo mask used for exposure before or after the exposure using interference of light has a second shading region and a second translucent region adjacent to each other;

the first shading region and the second shading region are substantially aligned in location in the first photo mask and the second photo mask;

the first translucent region and the second translucent region are substantially aligned in location in the first photo mask and the second photo mask;

the first shading region is corrected in width in the direction of adjacent alignment of the first shading region and the first translucent region; and the second shading region is corrected in width in the direction of adjacent alignment of the second shading region and the second translucent region.

According to the second aspect of the invention, there is provided a resist pattern fabricating method configured to fabricate a single-layered resist pattern on a resist coated on a substrate by executing a plurality of times of exposure including first exposure using a first photo mask and interference of light and a second exposure using a second photo mask, characterized in that:

a first shading region formed on the first photo mask and a second shading region formed on the second photo mask are substantially aligned in location on the first photo mask and the second photo mask; and a first translucent region formed on the first photo mask and a second translucent region formed on the second photo mask are substantially aligned in location on the first photo mask and the photo mask, and comprising the steps of:

conducting the first exposure of the first shading region by using the first photo mask corrected in width in the direction of adjacent alignment of the first shading region and the first translucent region; and conducting the second exposure of the second shading region by using the second photo mask corrected in width in the direction of adjacent alignment of the second shading region and the second translucent region.

According to the third aspect of the invention, there is provided A semiconductor device manufacturing method configured to make a resist pattern on a resist coated on a semiconductor substrate by executing a plurality of times of exposure including first exposure using a first photo mask and interference of light and second exposure using a second photo mask, and thereafter process the semiconductor substrate by using the resist pattern as a mask, characterized in that:

a first shading region formed on the first photo mask and a second shading region formed on the second photo mask are substantially aligned in location on the first photo mask and the second photo mask; and a first translucent region formed on the first photo mask and a second translucent region formed on the second photo mask are substantially aligned in location on the first photo mask and the photo mask, and comprising the steps of:

conducting the first exposure of the first shading region by using the first photo mask corrected in width in the direction of adjacent alignment of the first shading region and the first translucent region; and conducting the second exposure of the second shading region by using the second photo mask corrected in width in the direction of adjacent alignment of the second shading region and the second translucent region.

In the present invention, since influences of a mask fabrication error by correction of the second shading region of the second photo mask are larger than influences of a mask fabrication error by correction of the first shading region of the first photo mask, correction of the second shading region of the second photo mask is preferably conducted preferentially. Further, in the present invention, correction of the first shading region includes correction by which the correction amount results in zero.

In the present invention, correction of the first shading region and correction of the second shading region are conducted toward reducing the line width range in the single-layered resist pattern made by at least two exposure steps using a first photo mask and a second photo mask, respectively.

In the present invention, in the first translucent region and the first shading region adjacent to each other in the first photo mask, a third translucent region is typically provided to sandwich the first shading region, and light beams transmitting the first translucent region and the third translucent region are different in phase by approximately 180°.

In the present invention, since high-resolution exposure using interference of light must be conducted, the first photo mask is typically a phase shift mask. Further, in the present invention, the phase shift mask is typically a Rebenson phase shift mask, but if necessary, a half-tone phase shift mask, an auxiliary pattern mask, edge-enhanced phase shift mask, chromeless phase shift mask, or the like, may be used.

In the present invention, since normal exposure is conducted after exposure using the first photo mask and using interference of light, the second photo mask is typically a binary mask.

In the photo mask pattern designing method resist pattern fabricating method and semiconductor device manufacturing method according to the invention as summarized above, since correction is made for the line width of the first shading region and also for the width of the second shading region, it is possible to ensure correction taking account of the fabrication limit of the mask and reliably provide the ED window made up of the exposure tolerance and depth of focus of a sufficiently wide range.

The above, and other, objects, features and advantage of the present invention will become readily apparent from the following detailed description thereof which is to be read in connection with the accompanying drawings.

BRIEF DESCRIPTION OF THE DRAWINGS

FIGS. 3A and 3B show ED windows in the phase shift mask and the binary mask according to the embodiment of the invention;

FIG. 4 is a flow chart for explaining a photo mask pattern designing method according to the first embodiment of the invention;

FIGS. 8A and 8B show ED windows in the phase shift mask and the binary mask after correction according to the embodiment of the invention; and FIG. 9 is a common ED window that is common to the ED window of the isolated pattern and the ED window of the L/S pattern according to the embodiment of the invention.

DETAILED DESCRIPTION OF THE PREFERRED EMBODIMENT

Figure 1A:
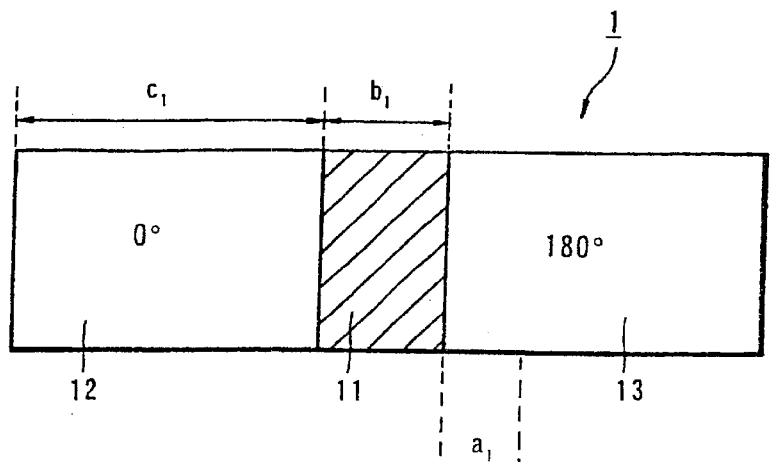
FIG. 1, consisting of FIGS. 1A and 1B, is a plan view that shows a pattern configuration of an isolated pattern used for ED window evaluation for a phase shift mask according to an embodiment of the invention.

An embodiment of the invention will be explained below with reference to the drawings. In all figures illustrating the embodiment, the same or equivalent elements are labeled with common reference numerals.

Explanation will be started with a resist pattern fabricating method according to the embodiment of the invention. In this embodiment, the base for making a resist pattern on is a base having a 70 nm thick organic nonreflecting film, for example, formed by spin coating on a silicon (Si) substrate, for example.

First using a resist coating apparatus, by spin coating, for example, a chemically amplified positive resist having a thickness around 400 nm, for example, is coated on the base, and thereafter, it is pre-baked at the temperature of 110° C. for 90 seconds, for example.

After that, twin exposure using a KrF excimer laser stepper, for example, is conducted. The twin exposure according to the embodiment will be explained below.

First explained is the photo mask used in the resist pattern exposure method according to the embodiment. FIGS. 1 and 2 illustrate an example of pattern configurations on a photo mask, assuming a gate of a DRAM-incorporated logic LSI used in the embodiment. This embodiment is explained as making a resist pattern for fabricating a gate pattern of a DRAM-incorporated logic LSI having the gate length of 0.10 μm.

Figure 1B:
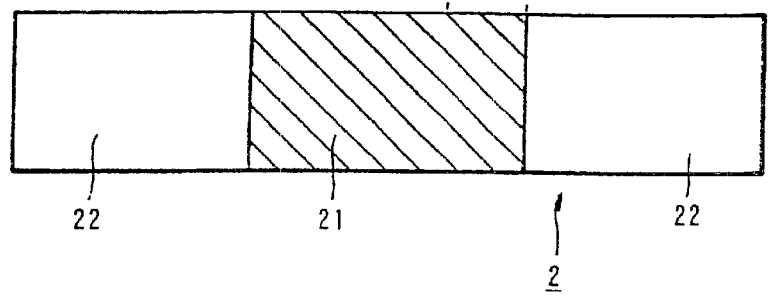

FIG. 1 shows an isolated pattern for making a resist pattern with an isolated line pattern configuration having the gate length of 0.10 μm, for example, assuming a gate in a logic portion. The pattern configuration shown in FIG. 1A is that on a phase shift mask 1 whereas the pattern configuration shown in FIG. 1B is that on a binary mask 2. In FIGS. 1A and 1B, hatched portions are shading regions, and the other regions are translucent regions. These shading regions and translucent regions lie in corresponding locations in the phase shift mask 1 and the binary mask 2. The translucent region 12 and the translucent region 13 at opposite sides of the shading region (mask pattern) 11 of the phase shift mask 1 shown in FIG. 1A are configured such that beams of light transmitting them are different in phase from each other by approximately 180°. The width of the shading region 21 shown in FIG. 1B toward the adjacent translucent region 22 is larger than the shading region 11 of the phase shift mask 1. The overlapping width $a_1$ of the translucent region 12 of the phase shift mask 1 and the shading region 21 of the binary mask 2, the line width $b_1$ of the shading region 11 of the phase shift mask 1 in the direction toward the translucent region 12 adjacent to the shading region 11, and the width $c_1$ of the translucent region 12 in the same direction are determined to be optimum values, depending upon the line width of an intended resist pattern. A correction method for optimizing the values will be explained later.

Figure 2A:
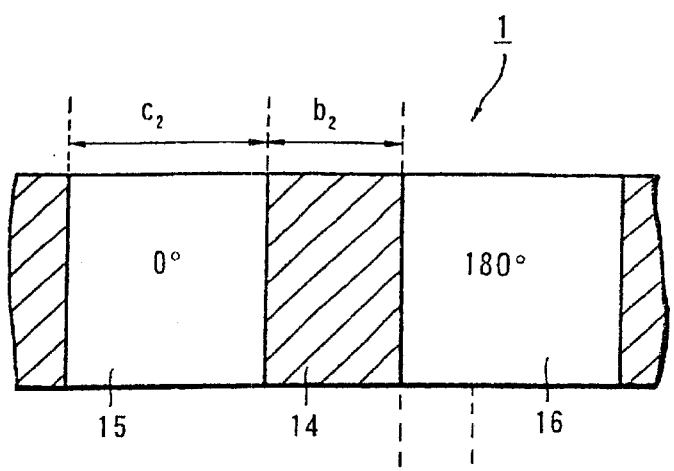
FIG. 2, consisting of FIGS. 2A and 2B, is a plan view that shows a pattern configuration of an L/S pattern used for ED window evaluation for a binary mask according to the embodiment of the invention.
Figure 2B:
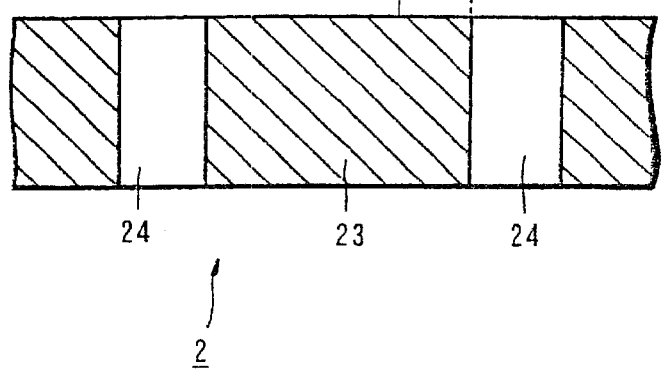

FIG. 2 shows an L/S pattern for making a resist pattern having a line-and-space pattern (L/S pattern) configuration having the gate length of 0.10 μm and the gate pitch of 0.34 μm, for example, assuming a gate in a DRAM portion. The pattern configuration shown in FIG. 2A is that on the phase shift mask 1 whereas the pattern configuration shown in FIG. 2B is that on the binary mask 2. In FIGS. 2A and 2B, hatched portions are shading regions, and the other regions are translucent regions. They are configured such that beams of light transmitting the translucent region 15 and the translucent region 16 at opposite sides of the shading region (mask pattern) 14 shown in FIG. 2A are different in phase from each other by 180°. The width of the shading region 23 shown in FIG. 1B toward the adjacent translucent region 24 is larger than the shading region 14 of the phase shift mask 1. In this embodiment, the overlapping width $a_2$ of the translucent region 16 of the phase shift mask 1 and the shading region 23 of the binary mask 2, the line width $b_2$ of the shading region 14 of the phase shift mask toward the translucent region 15, and the width $c_2$ of the translucent region 15 in the same direction are determined to be optimum values, depending upon the line width in the intended resist pattern. A correction method for optimizing these values will be explained later.

In the twin exposure using the photo mask having the above-explained configuration, predetermined exposure is conducted to each resist as the first exposure by fixing the numerical aperture (NA) at 0.60 and using the phase shift mask 1 having the pattern shown in FIGS. 1A and 2A. Subsequently, the second exposure is conducted by using the binary mask 2 having the pattern shown in FIG. 1B and FIG. 2B. In an example of optical conditions for the second exposure, the partial coherence factor (σ) is 0.53, the exposure is 26 mJ/cm², and the focus is −0.1 μm. The second exposure can be executed by using deformed illumination like ½ zone illumination.

After the twin exposure is conducted in this manner, post-exposure baking is conducted at the temperature of 100° C. for 90 seconds, for example. After that, using a developer made up of tetramethyl ammonium hydroxide (TMAH) having the concentration of 2.38%, for example, paddle development is conducted for 60 seconds, for example. After that, subsequently to rinsing with pure water, post-baking processing is performed at the temperature of 100° C. for 90 seconds, for example.

Through those steps, an isolated pattern assuming a gate of a logic portion and a resist pattern (not shown) having the L/S pattern assuming a gate of a DRAM portion are obtained.

After that, the resist pattern formed on the base by the above-explained method undergoes evaluation of the isolated pattern and the L/S pattern, using an ED window made of the exposure tolerance and the depth of focus. This evaluation is made on a sample having the overlapping width $a_1$ shown in FIG. 1 being 60 nm, the line width $b_1$ of the shading region 11 being 130 nm, the width $c_1$ of the translucent region 12 being 500 nm, and overlapping width $a_2$ shown in FIG. 2 being 60 nm, the line width $b_2$ of the shading region 14 being 130 nm, and the width $c_2$ of the translucent region 15 being 210 nm. Additionally, the partial coherence factor (σ) is 0.53 like that of the second exposure, and as the line width standard, the value of 0.10 μm±0.01 μm is the tolerance. A window obtained by that ED window evaluation is shown in FIG. 3. FIG. 3A shows the window in the isolated pattern whereas FIG. 3B shows the window in the L/S pattern.

It is appreciated from FIG. 3A that an ED window having exposure in the range of 30~32 mJ/cm² and the focus of −0.3~0.1 μm is obtained as the ED window in which the line width of the resist pattern limits in the range of 0.09~0.11 μm in the isolated pattern in a resist pattern. It is appreciated from FIG. 3A that the tolerance for exposure in the isolated pattern is ((32−30)/31=)6.5%, and the depth of focus is (0.1−(−0.3)=) is 0.4 μm.

On the other hand, it is appreciated from the window shown in FIG. 3B that an ED window having exposure in the range of 48~52 mJ/cm² and the focus of −0.2~0.3 μm is obtained as the ED window in which the line width of the resist pattern limits in the range of 0.09~0.11 μm in the L/S pattern in a resist pattern. It is appreciated from FIG. 3B that the tolerance for exposure in the isolated pattern is ((52−48)/50=)8%, and the depth of focus is (0.3−(−0.2)=) is 0.5 μm.

Then, it is appreciated that the isolated pattern and the L/S pattern are largely different in optimum exposure in the ED window of the isolated pattern shown in FIG. 3A and the ED window of the L/S pattern shown in FIG. 3B. That is, it is understood that in the ED window, the optimum exposure in the L/S pattern is larger than the optimum exposure in the isolated pattern by 19 mJ/cm², and a common ED window cannot be obtained.

With such a large difference in optimum exposure, if a resist pattern having both an isolated pattern and an L/S pattern in a common layer is made and the exposure is adjusted at the optimum exposure of the isolated pattern or that of the L/S pattern, it is expected that the line width difference due to the difference in pattern density will be enlarged.

Thus, in this embodiment, correction is made to two kinds of masks, namely, the phase shift mask 1 and the binary mask 2 used in the twin exposure toward substantially equalizing their optimum exposures from the ED windows shown in FIGS. 3A and 3B.

Here is explained a method for designing a photo mask pattern according to the embodiment. FIG. 4 shows a flow chart of the photo mask correction method according to the embodiment.

As shown in FIG. 4, in the photo mask pattern designing method according to the embodiment, the pattern configuration of the single-layered resist pattern to be made is first divided into a plurality of pattern configurations having the same line width and/or the same pitch in step ST1. In this embodiment, the example of the pattern configuration obtained by division in step ST1 is assumed to be the isolated pattern configuration shown in FIG. 1 (first pattern) and the L/S pattern configuration shown in FIG. 2 (second pattern).

In the next step ST2, optimum exposure is obtained in each of the patterns divided in step ST1 and having the same line width and the same pitch. In this embodiment, the optimum exposure in the isolated pattern shown in FIG. 1 and the optimum exposure in the L/S pattern shown in FIG. 2 are obtained. The optimum exposure in the isolated pattern shown in FIG. 1 is 30~32 mJ/cm² as shown in the ED window of FIG. 3A, and the optimum exposure in the L/S pattern shown in FIG. 2 is 48~52 mJ/cm² as shown in the ED window of FIG. 3B. That is, the optimum exposure values in the isolated pattern and the L/S pattern obtained by step ST2 are different by 19 mJ/cm².

Then, in step ST3, correction is made to the pattern configuration of the phase shift mask 1 and the pattern configuration of the binary mask 2 to equalize the optimum exposure values of all patterns divided in step ST1. In this embodiment, since the optimum exposure in the L/S pattern is larger than the optimum exposure in the isolated pattern, the pattern configurations are corrected toward decreasing the optimum exposure in the L/S pattern and increasing the optimum exposure in the isolated pattern to substantially equalize their optimum exposure values.

Figure 5A:
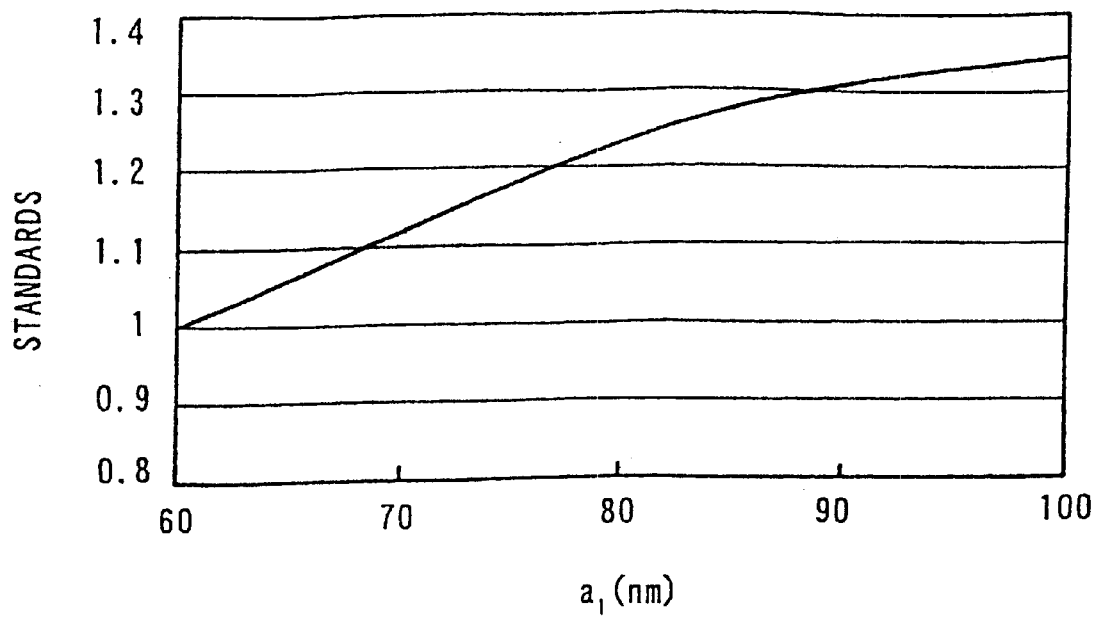
FIG. 5A is a graph that shows changes in optimum exposure in the isolated pattern in the embodiment of the invention which occur depending upon the overlapping width.
Figure 5B:
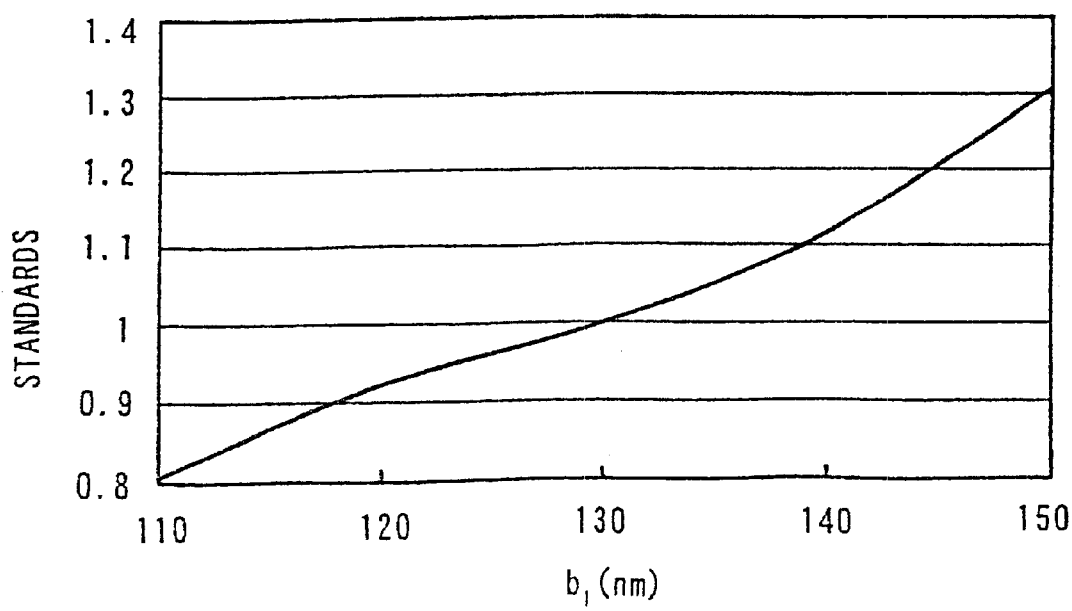
FIG. 5B is a graph that shows changes in same which occur depending upon the line width.

FIGS. 5A and 5B show dependency of the line width of the photo mask pattern upon the optimum exposure. FIG. 5A is a graph standardizing the optimum exposure by the optimum exposure upon $a_1$ being 60 nm when fixing the line width $b_1$ of the isolated pattern in the phase shift mask 1 shown in FIG. 1A at 130 nm and changing the overlapping width $a_1$ of the translucent region 13 of the phase shift mask 1 and the shading region 21 of the binary mask 2 shown in FIG. 1. FIG. 5B is a graph standardizing the optimum exposure by the optimum exposure upon $b_1$ being 130 nm when fixing the overlapping width $a_1$ of the translucent region 13 of the phase shift mask 1 and the shading region 21 of the binary mask 2 shown in FIG. 1 at 60 nm and changing the line width $b_1$ of the isolated pattern in the phase shift mask 1. It is appreciated from FIG. 5A that the optimum exposure increases with an increase of $a_1$. It is appreciated from FIG. 5B that the optimum exposure increases with an increase of $b_1$. It is further appreciated that the increase amount of the optimum exposure with the increase of $a_1$ is smaller than the increase amount of the optimum exposure with the increase of $b_1$.

Figure 6A:
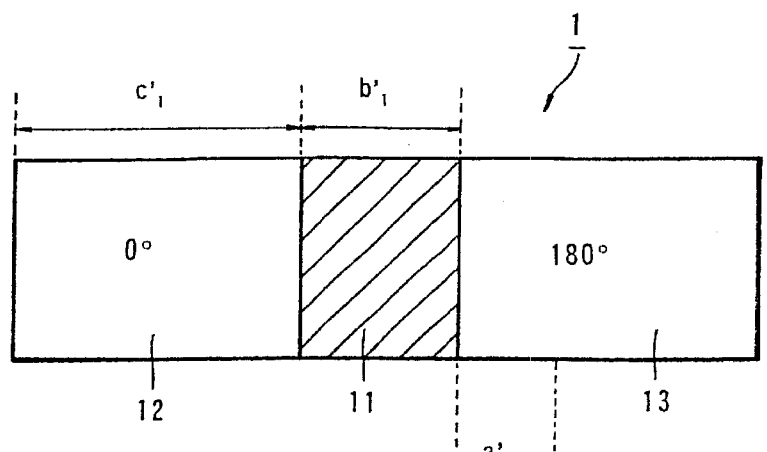
FIG. 6, consisting of FIGS. 6A and 6B, is a plan view that shows a pattern configuration of the phase shift mask and the binary mask in the isolated pattern after correction according to an embodiment of the invention.
Figure 6B:
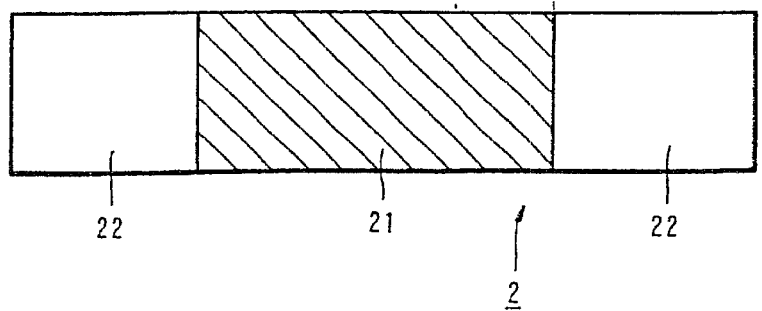

Then, in order to increase the optimum exposure for the isolated pattern in the phase shift mask 1 shown in FIG. 1A, after correcting the overlapping width $a_1$ of the shading region 13 and the binary of the phase shift mask 1 and the shading region 21 of the binary mask 2, the line width $b_1$ of the pattern of the phase shift mask 1 in the isolated pattern is corrected. In this embodiment, as shown in FIG. 6, for example, correction is made to increase the overlapping width $a_1$ of the translucent region 13 of the phase shift mask 1 and the shading region 21 of the binary mask 2 from $a_1$=60 nm to $a_1'$=100 nm, and at the same time, correction is made to increase the line width of the pattern of the phase shift mask 1 from $b_1$=130 nm to $b_1'$=150 nm. As already explained, the increase amount of the optimum exposure along with the increase of $a_1$ is smaller than the increase amount of the optimum exposure along with the increase of $b_1$. This means that influences of a fabrication error of a mask with the overlapping width $a_1$ are larger than influences of a fabrication error of a mask with the line width $b_1$. That is, from the viewpoint of manufacturing a photo mask, correction in the overlapping width $a_1$ should be preferred to correction in the line width $b_1$. Further, since the line width $b_1$ of the pattern of the phase shift mask 1 is around the fabrication limit of a mask in most cases, and also because correction to decrease the line width $b_1$ is more difficult than correction to decrease the overlapping width $a_1$, it is recommended to prefer correction to the overlapping width $a_1$. That is, the overlapping width $a_1$ is corrected until the increase amount of the optimum exposure substantially converges by the graph shown in FIG. 5, and if a further increase of the optimum exposure is necessary, the line width $b_1$ is corrected. In the case where correction is made toward decreasing the optimum exposure, correction is made toward decreasing at least one of the overlapping width $a_1$ of the translucent region 13 of the phase shift mask 1 and the shading region 21 of the binary mask 2 and the line width $b_1$ of the pattern of the phase shift mask 1.

Figure 7A:
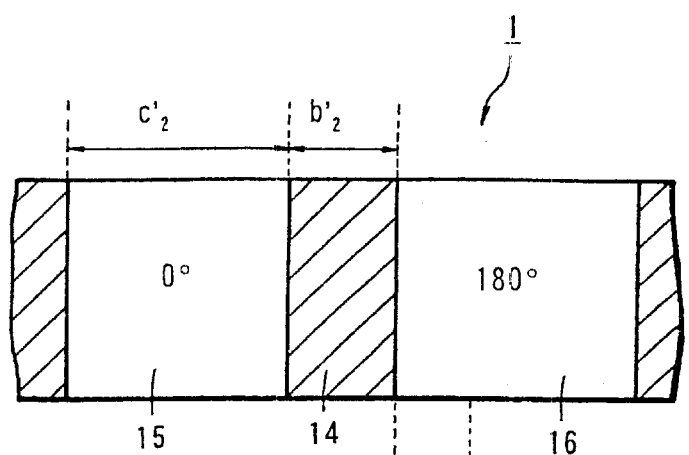
FIG. 7, consisting of FIGS. 7A and 7B, is a plan view that shows a pattern configuration of the phase shift mask and the binary mask in the L/S pattern after correction according to the embodiment of the invention.
Figure 7B:
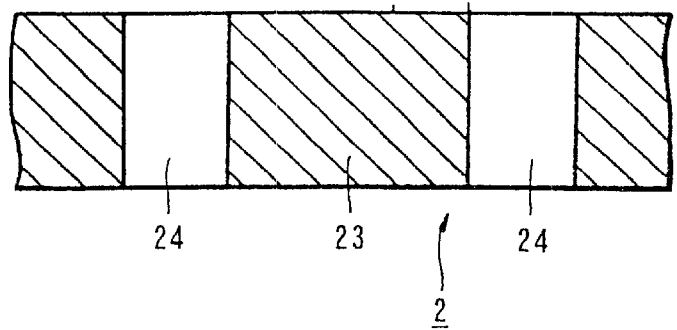

Further, in order to decrease the optimum exposure in the phase shift mask 1 of the L/S pattern shown in FIG. 2A, at least one of the line width $b_2$ of the phase shift mask 1 and the overlapping width $a_2$ of the translucent region 16 of the phase shift mask 1 and the shading region 23 of the binary mask 2 is corrected. That is, concretely, correction is made toward decreasing the line width of the phase shift mask 1 of the L/S pattern. In this embodiment, correction is made to decrease the line width of the pattern of the phase shift mask 1 from $b_2$=130 nm to $b_2'$=110 nm as shown in FIG. 7. In the case where correction is made toward increasing the optimum exposure, it is done toward decreasing at least one of the overlapping width $a_2$ of the translucent region 16 of the phase shift mask 1 and the shading region 24 of the binary mask 2 and the line width $b_2$ of the shading region 14 of the phase shift mask 1.

After that, in step ST4 shown in FIG. 4, it is judged whether the correction amount by the correction explained below is within the fabrication limit of the phase shift mask 1 and the binary mask 2 or not.

If the correction amount is judged to be out of the fabrication limit in step ST4, then the flow moves to step ST3 to correct the overlapping width $a_1$ and the line width b1 of the isolated pattern of the phase shift mask shown in FIG. 1 and the overlapping width $a_2$ and the line width $b_2$ of the L/S pattern of the phase shift mask shown in FIG. 2 toward equalizing their optimum exposure values.

On the other hand, it the correction amount is judged to be within the fabrication limit in step ST4, the flow moves to step ST5.

In step ST5, the EP window is confirmed for the resist pattern made by using the photo mask after correction of equalizing the optimum exposure values. The ED window in the isolated pattern after correction is shown in FIG. 8A, and the ED window in the L/S pattern is shown in FIG. 8B.

It is appreciated from FIG. 8A that in the ED window in the isolated pattern after correction according to the embodiment, the optimum exposure is 42~44 mJ/cm$^2$, and the optimum focus is −0.3~0.1 μm. At that time, ((44−42)/43=)4.7% as the tolerance for exposure and 0.4 μm as the depth of focus are ensured.

Additionally, it is appreciated from FIG. 8B that, from the viewpoint of attaching importance to ensuring the tolerance for exposure in the ED window in the L/S pattern after correction in this embodiment, the optimum exposure is 40~44 mJ/cm$^2$ and the optimum focus is −0.2~0.2 μm. At that time, ((44−40)/42=)9.5% as the tolerance for exposure and 0.4 μm as the depth of focus are ensured. On the other hand, in the ED window shown in FIG. 8B, it is appreciated that from the viewpoint of attaching importance to ensuring the depth of focus, the optimum exposure is 40~43 mJ/cm$^2$ and the optimum focus is −0.3~0.2 μm. At that time, ((43−40/42=)7.2% as the tolerance for exposure and 0.5 μm as the depth of focus are ensured.

FIG. 9 shows a common ED window extracted from the ED windows shown in FIGS. 8A and 8B. It is appreciated from the common ED window 31 that in case of co-existence of an isolated pattern and an L/S pattern, the optimum exposure is 42~44 mJ/cm$^2$ and the optimum focus is −0.2~0.1 μm and that in case of exposure of the resist pattern including both the isolated pattern shown in FIG. 1A and the L/S pattern shown in FIG. 2A, the exposure is preferably 42~44 mJ/cm$^2$ and the focus is preferably −0.2~0.1 μm. At that time, (42~44)/43=)4.7% as the exposure tolerance and 0.3 μm as the depth of focus are ensured, the ED window of a sufficient size can be obtained, and a sufficient lithographic process tolerance can be ensured. Also when comparing them with the exposure tolerance and the depth of focus in the respective ED windows shown in FIGS. 8A and 8B, it is appreciated that substantially the same exposure is ensured, and a sufficient lithographic process tolerance can be ensured without inviting reduction of the exposure tolerance and the depth of focus.

On the other hand, in the respective ED windows after correction of the isolated pattern and the L/S pattern, if no common ED window is obtained, then the flow moves to step ST3, and the phase shift mask 1 and the binary mask 2 are corrected again in the same manner as already explained.

By correcting $a_1$, $a_2$, $b_1$ and $b_2$ through those steps, correction amounts in the phase shift mask 1 and the binary mask 2 corresponding to the final pattern density are determined. Then, conditions for the line widths $b_1$ and $b_2$ of patterns in the phase shift mask 1, capable of ensuring a sufficient lithographic process tolerance, and conditions for the line width of the binary mask 2 in accordance with the overlapping widths $a_1$ and $a_2$ with the binary mask 2 can be determined efficiently.

As explained above, according to the invention, in case of making a resist pattern by conducting exposure at least twice, since the correction amounts in the phase shift mask 1 and the binary mask 2 as determined by using ED windows after dividing the resist pattern into patterns having the same line width and/or the same pitch, it is possible to efficiently correct the photo mask used for fabricating the resist pattern including a plurality of patterns such as isolated pattern and L/S pattern, for example, thereby easily fix their line widths, and enlarge the depth of focus in exposure and the exposure tolerance upon fabricating the resist pattern. Additionally, in this embodiment, since correction is made to the shading region 21 of the binary mask 2 used for the second exposure, having a larger pattern size than that of the phase shift mask 1, the correction for reducing the pattern size can be minimized, and the correction amount of the phase shift mask 1, difficult to be reduced in pattern size, can be minimized. More specifically, the line width $b_2$ in the shading region of the L/S pattern, which will be the smallest after correction, is around 110 nm, and it is possible to amply cope with the mask fabricating technique for the generation of 0.13 μm. Further, also regarding fabrication of a mask, since the fabrication limit is taken into account, it is possible to ensure a high resolution, sufficient exposure tolerance, depth of focus and alignment accuracy, depending upon the line width of the pattern possible to fabricate, even when the line width of the pattern possible to make in the mask is reduced. Since the exposure tolerance the depth of focus can be enlarged in this manner, the invention is readily applicable to mass production of semiconductor devices.

Although an embodiment of the invention has been explained concretely, the invention is not limited to the embodiment, but involves various modifications based on the technical concept of the invention.

For example, numerical values indicated in the explanation of the foregoing embodiment are not but examples, and any appropriate other numerical values may be employed, if necessary. For example, since numerical values of $a_1$, $a_2$, $b_1$, $b_2$, $c_1$ and $cz_2$ shown in the embodiment are those to be determined appropriately depending upon the line width of a target resist pattern, it is possible to employ other numerical values, taking the target resist pattern and the limit of pattern line width possible to fabricate into consideration, and the invention is not limited to the use of the said numerical values.

Further, in the case where a DRAM-incorporated logic LSI by using a semiconductor substrate such as Si substrate or GaAs substrate having formed a semiconductor device as the base upon making a resist pattern, for example, after the resist pattern is fabricated, etching and impurity-doping may be conducted to a conductive film and an insulating film formed on a semiconductor substrate by a known method, using that resist pattern as a mask, to manufacture the target DRAM-incorporated logic LSI through predetermined processes sequentially.

Furthermore, as the base for making the resist pattern according to the invention, for example, it is possible to use any of various types of bases such as a base having formed wiring and a base having formed an inter-layer insulating film on a semiconductor substrate having formed a semiconductor device, for example. The method for fabricating the resist pattern according to the invention is applicable to all cases where a resist pattern having both a regular pattern and a random pattern has to be made.

As described above, according to the first aspect of the invention, a photo mask pattern can be corrected, with which a resist pattern locally different in pattern density can be made accurately while ensuring a sufficient exposure tolerance and a sufficient lithographic process tolerance such as depth of focus, for example.

According to the second aspect of the invention, a resist pattern locally different in pattern density can be made accurately while ensuring a sufficient exposure tolerance and a sufficient lithographic process tolerance such as depth of focus, for example.

According to the third aspect of the invention, a resist pattern locally different in pattern density can be made accurately while ensuring a sufficient exposure tolerance and a sufficient lithographic process tolerance such as depth of focus, for example. Therefore, the invention is applicable to a mass-manufacturing process of semiconductor devices each having patterns different in pattern density, and even in this case, semiconductor devices with a high reliability can be manufactured.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A photo mask pattern designing method configured to correct pattern configuration of at least one of a plurality of kinds of photo masks for making a single-layered resist pattern by transferring pattern configuration by use of multiple exposures of a resist coated on a substrate, characterized in that:
    a first photo mask used for exposure using interference of light from said multiple exposures has a first shading region and a first translucent region adjacent to each other;
    a second photo mask used for exposure before or after said exposure using interference of light has a second shading region and a second translucent region adjacent to each other;
    said first shading region and said second shading region are substantially aligned in location in said first photo mask and said second photo mask;
    said first translucent region and said second translucent region are substantially aligned in location in said first photo mask and said second photo mask;
    said first shading region is corrected in width in the direction of adjacent alignment of said first shading region and said first translucent region; and
    said second shading region is corrected in width in the direction of adjacent alignment of said second shading region and said second translucent region.

2. The photo mask pattern designing method according to claim 1 wherein correction of said second shading region in said second photo mask is preferentially conducted.

3. The photo mask pattern designing method according to claim 1 wherein said first photo mask is a phase shift mask.

4. The photo mask pattern designing method according to claim 1 wherein said second photo mask is a binary mask.

5. The photo mask pattern designing method according to claim 1 wherein said pattern configuration of said single-layered resist pattern is divided into pattern configurations having substantially the same line width and substantially the same pitch.

6. The photo mask pattern designing method of claim 1, wherein said first photo mask and said second photo mask are used to fabricate a Single-layered resist pattern on a resist coated on a substrate.

7. The photo mask pattern designing method of claim 1, wherein:
    exposure of said corrected first shading region has corrected first optimum exposure values;
    exposure of said corrected second shading region has corrected second optimum exposure values;
    said corrected first optimum exposure values being substantially equal to said corrected second optimum exposure values.

8. The photo mask pattern designing method of claim 7, wherein:
    said corrected first optimum exposure values including a first range of exposure values and a first range of focus values;
    said corrected second optimum exposure values including a second range of exposure values and a second range of focus values;
    said first range of exposure values overlapping said second range of exposure values;
    said first range of focus values overlapping said second range of focus values.

9. The photo mask pattern designing method of claim 7, wherein:
    said second shading region is corrected in width prior to correcting said first shading region in width,
    said first shading region being corrected in width only when correction in width of said second shading region fails to bring about said corrected first optimum exposure values as substantially equal to said corrected second optimum exposure values.

10. A resist pattern fabricating method configured to fabricate a single-layered resist pattern on a resist coated on a substrate by executing a plurality of times of exposure including first exposure using a first photo mask and interference of light and a second exposure using a second photo mask, characterized in that:
    a first shading region formed on said first photo mask and a second shading region formed on said second photo mask are substantially aligned in location on said first photo mask and said second photo mask; and
    a first translucent region formed on said first photo mask and a second translucent region formed on said second photo mask are substantially aligned in location on said first photo mask and said second photo mask, and comprising the steps of:
    conducting said first exposure of said first shading region by using said first photo mask corrected in width in the direction of adjacent alignment of said first shading region and said first translucent region; and
    conducting said second exposure of said second shading region by using said second photo mask corrected in width in the direction of adjacent alignment of said second shading region and said second translucent region.

11. The resist pattern fabricating method according to claim 10 wherein correction of said second shading region in said second photo mask is preferentially conducted.

12. The resist pattern fabricating method according to claim 10 wherein said first photo mask is a phase shift mask.

13. The resist pattern fabricating method according to claim 10 wherein said second photo mask is a binary mask.

14. The resist pattern fabricating method as set forth in claim 10, wherein said first photo mask and said second photo mask are patterned.

15. The resist pattern fabricating method as set forth in claim 10, wherein exposure of said corrected first shading region has corrected first optimum exposure values;

exposure of said corrected second shading region has corrected second optimum exposure values;

said corrected first optimum exposure values being substantially equal to said corrected second optimum exposure values.

16. The photo mask pattern designing method of claim 15, wherein:

said corrected first optimum exposure values including a first range of exposure values and a first range of focus values;

said corrected second optimum exposure values including a second range of exposure values and a second range of focus values;

said first range of exposure values overlapping said second range of exposure values;

said first range of focus values overlapping said second range of focus values.

17. The photo mask pattern designing method of claim 15, wherein:

said second shading region is corrected in width prior to correcting said first shading region in width, said first shading region being corrected in width only when correction in width of said second shading region fails to bring about said corrected first optimum exposure values as substantially equal to said corrected second optimum exposure values.

18. A semiconductor device manufacturing method configured to make a resist pattern on a resist coated on a semiconductor substrate by executing a plurality of times of exposure including first exposure using a first photo mask and interference of light and second exposure using a second photo mask, and thereafter process said semiconductor substrate by using said resist pattern as a mask, characterized in that:

a first shading region formed on said first photo mask and a second shading region formed on said second photo mask are substantially aligned in location on said first photo mask and said second photo mask; and a first translucent region formed on said first photo mask and a second translucent region formed on said second photo mask are substantially aligned in location on said first photo mask and said photo mask, and comprising the steps of:

conducting said first exposure of said first shading region by using said first photo mask corrected in width in the direction of adjacent alignment of said first shading region and said first translucent region; and conducting said second exposure of said second shading region by using said second photo mask corrected in width in the direction of adjacent alignment of said second shading region and said second translucent region.

19. The semiconductor device manufacturing method according to claim 18 wherein correction of said second shading region in said second photo mask is preferentially conducted.

20. The semiconductor device manufacturing method according to claim 18 wherein said first photo mask is a phase shift mask.

21. The semiconductor device manufacturing method according to claim 18 wherein said second photo mask is a binary mask.

22. The semiconductor device manufacturing method as set forth in claim 18, wherein said first photo mask and said second photo mask are patterned.

23. The semiconductor device manufacturing method as set forth in claim 18, wherein:

exposure of said corrected first shading region has corrected first optimum exposure values;

exposure of said corrected second shading region has corrected second optimum exposure values;

said corrected first optimum exposure values being substantially equal to said corrected second optimum exposure values.

24. The photo mask pattern designing method of claim 23, wherein:

said corrected first optimum exposure values including a first range of exposure values and a first range of focus values;

said corrected second optimum exposure values including a second range of exposure values and a second range of focus values;

said first range of exposure values overlapping said second range of exposure values;

said first range of focus values overlapping said second range of focus values.

25. The photo mask pattern designing method of claim 23, wherein:

said second shading region is corrected in width prior to correcting said first shading region in width, said first shading region being corrected in width only when correction in width of said second shading region fails to bring about said corrected first optimum exposure values as substantially equal to said corrected second optimum exposure values.

* * * * *